(12) United States Patent
Hayasi

(10) Patent No.: US 6,329,707 B1
(45) Date of Patent: Dec. 11, 2001

(54) TWIN TRANSISTOR DEVICE WITH IMPROVED COLLECTOR-BASE ISOLATION

(75) Inventor: Kouzi Hayasi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/545,325

(22) Filed: Apr. 7, 2000

(30) Foreign Application Priority Data

Apr. 8, 1999  (JP) .................................................. 11-101498

(51) Int. Cl.[7] .................................................. H01L 23/495
(52) U.S. Cl. .................... 257/676; 257/566; 257/692; 257/696; 257/724
(58) Field of Search .................................... 257/566, 578, 257/584, 587, 666, 676, 687, 690, 692, 693, 696, 698, 723, 724, 725, 734, 735, 773, 776, 784

(56) References Cited

U.S. PATENT DOCUMENTS 5,075,759 * 12/1991  Moline .................................. 257/692

FOREIGN PATENT DOCUMENTS

06310662-A  * 11/1994  (JP) .............................. H01L/27/04

* cited by examiner

Primary Examiner—Nathan Flynn
Assistant Examiner—Scott R Wilson
(74) Attorney, Agent, or Firm—Sughrue, Mion, Zinn, Macpeak & Seas, PLLC

(57) ABSTRACT

A semiconductor device includes a first transistor chip, a first base lead, collector lead, and emitter lead, a second transistor chip, and a second base lead, collector lead, and emitter lead. The first base lead, collector lead, and emitter lead respectively have inner lead portions connected to the first transistor chip. The second base lead, collector lead, and emitter lead respectively have inner lead portions connected to the second transistor chip. The inner lead portion of the first emitter lead is arranged between the inner lead portion of the first base lead and the inner lead portion of the first collector lead. The inner lead portion of the second emitter lead is arranged between the inner lead portion of the second base lead and the inner lead portion of the second collector lead.

6 Claims, 4 Drawing Sheets

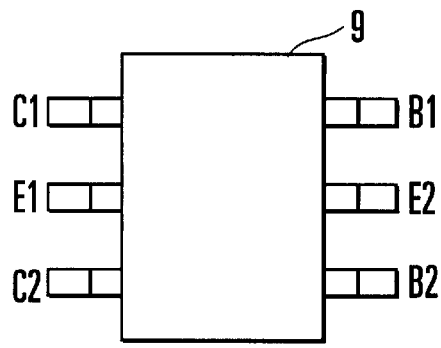 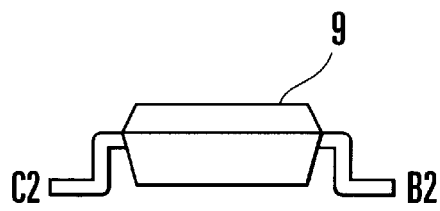
FIG.1A  FIG.1B
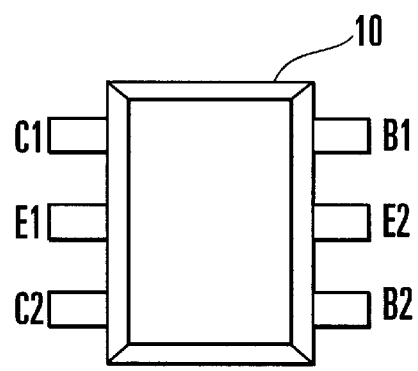 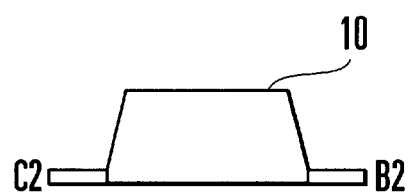
FIG.2A  FIG.2B
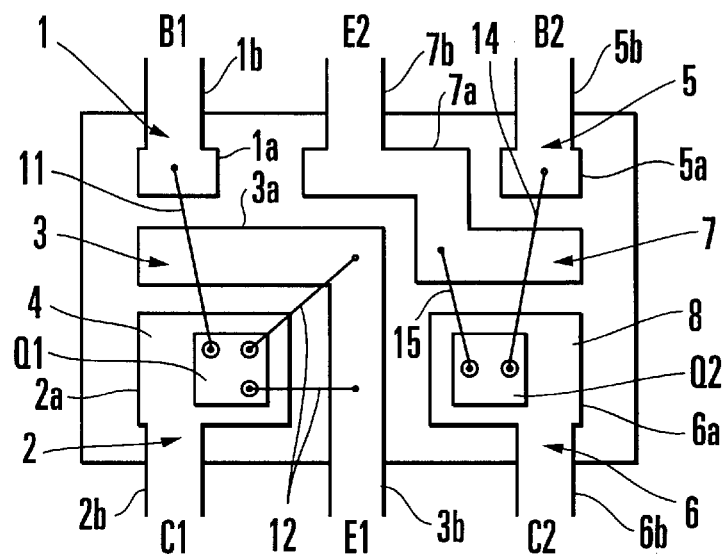
FIG.3

TWIN TRANSISTOR DEVICE WITH IMPROVED COLLECTOR-BASE ISOLATION

BACKGROUND OF THE INVENTION

The present invention relates to a semiconductor device such as a twin transistor package on which two transistor chips are mounted.

In the market of mobile communication, higher-gain, lower-noise, smaller-size, and lower-cost devices are requested, and high-performance, compact semiconductor devices are accordingly required. To meet this demand, twin transistor packages in which the packaging area and the number of packaging steps are reduced have conventionally been merchandized.

FIG. 9 shows the arrangement of components in a conventional twin transistor package.

Each of transistor chips (transistor pellets) Q11 and Q12 has a collector electrode on its lower surface and a base electrode and emitter electrode on its upper surface. The base electrode of the transistor chip Q11 and the inner lead portion of a base lead 31 are connected to each other through a base bonding wire 41. The emitter electrode of the transistor chip Q11 and the inner lead portion of an emitter lead 33 are connected to each other through an emitter bonding wire 42.

The base electrode of the transistor chip Q12 and the inner lead portion of a base lead 35 are connected to each other through a base bonding wire 44. The emitter electrode of the transistor chip Q12 and the inner lead portion of an emitter lead 37 are connected to each other through an emitter bonding wire 45. The inner lead portions of collector leads 32 and 36 respectively serve also as die pads 34 and 38 for placing the transistor chips Q11 and Q12 thereon.

In the twin transistor package described above, the gain and transition frequency of the transistor chip Q11 decrease. This is because since the base lead 31 of the transistor chip Q11 and the collector lead 32 are adjacent to each other, isolation between them is poor, and the collector-base capacitance becomes, e.g., about 80 fF.

Also, since the inner lead portion of the emitter lead 33 has a small bondable area, the emitter bonding wire 42 can be provided only one, and the emitter inductance of the transistor chip Q11 accordingly increases. The gain and transition frequency of the transistor chip Q12 also decrease from the same reason.

SUMMARY OF THE INVENTION

It is an object of the present invention to provide a semiconductor device in which the gain and transition frequency of incorporated transistor chips can be improved.

In order to achieve the above object, according to the present invention, there is provided a semiconductor device comprising a first transistor chip, a first base lead, first collector lead, and first emitter lead respectively having inner lead portions connected to the first transistor chip, the inner lead portion of the first emitter lead being arranged between the inner lead portion of the first base lead and the inner lead portion of the first collector lead, a second transistor chip, and a second base lead, second collector lead, and second emitter lead respectively having inner lead portions connected to the second transistor chip, the inner lead portion of the second emitter lead being arranged between the inner lead portion of the second base lead and the inner lead portion of the second collector lead.

BRIEF DESCRIPTION OF THE DRAWINGS

FIGS. 1A and 1B are plan and side views, respectively, showing the outer appearance of a twin transistor package according to the first embodiment of the present invention;

FIGS. 2A and 2B are plan and side views, respectively, showing the outer appearance of a twin transistor package transistor according to the first embodiment of the present invention;

FIG. 3 is a plan view showing the arrangement of components in the twin transistor package shown in FIGS. 1A and 1B and FIGS. 2A and 2B;

DESCRIPTION OF THE PREFERRED EMBODIMENTS

Figure 4:
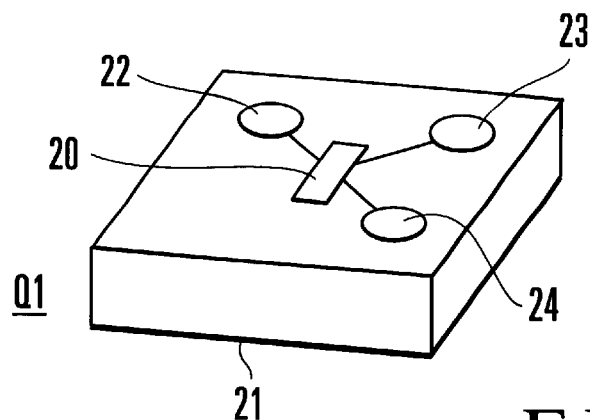
FIG. 4 is a perspective view of the first transistor chip shown in FIG. 3.

The present invention will be described in detail with reference to the accompanying drawings.

[First Embodiment]

A twin transistor package 9 shown in FIGS. 1A and 1B is a bent external lead type (gull wing lead type) package, and a twin transistor package 10 shown in FIGS. 2A and 2B is a non-bent external lead type (flat lead type) package.

Referring to FIGS. 1A, 1B, 2A, and 2B, the first transistor chip mounted on each of the twin transistor packages 9 and 10 has a base terminal B1, collector terminal C1, and emitter terminal E1, and the second transistor chip mounted thereon has a base terminal B2, collector terminal C2, and emitter terminal E2.

FIG. 3 shows the arrangement of components in the twin transistor package described above. In FIG. 3, the molded resin constituting the twin transistor package 9 or 10 is looked through.

Referring to FIG. 3, a base lead 1, collector lead 2, and emitter lead 3 for a first transistor chip (transistor pellet) Q1 respectively have inner and outer lead portions 1a and 1b, 2a and 2b, and 3a and 3b. The inner lead portions 1a, 2a, and 3a are connected to the base, collector, and emitter electrodes of the transistor chip Q1, and outer lead portions 1b, 2b, and 3b serve as the external leads of the package. The inner lead portion 3a of the emitter lead 3 is bent only once into an L shape and is arranged between the inner lead portion 1a of the base lead 1 and the inner lead portion 2a of the collector lead 2.

Similarly, a base lead 5, collector lead 6, and emitter lead 7 for a second transistor chip Q2 respectively have inner and outer lead portions 5a and 5b, 6a and 6b, and 7a and 7b. The inner lead portions 5a, 6a, and 7a are connected to the base, collector, and emitter electrodes of the transistor chip Q2, and outer lead portions 5b, 6b, and 7b serve as the external leads of the package. The inner lead portion 7a of the emitter lead 7 is bent twice into a crank shape and is arranged between the inner lead portion 5a of the base lead 5 and the inner lead portion 6a of the collector lead 6.

The inner lead portions 2a and 6a of the collector leads 2 and 6 also serve as die pads 4 and 8, respectively, on which the transistor chips Q1 and Q2 are to be mounted.

A method of manufacturing the twin transistor package having the above arrangement will be described.

Figure 5:
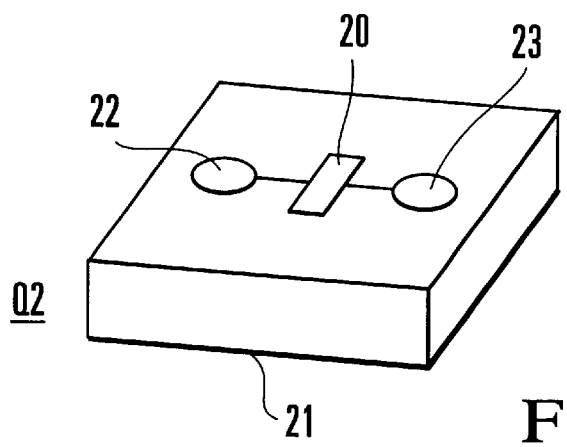
FIG. 5 is a perspective view of the second transistor chip shown in FIG. 3.

As shown in FIG. 4, the first transistor chip Q1 is fabricated. The first transistor chip Q1 has a lower surface on which a collector electrode 21 is formed partly or entirely, and an upper surface on which a base electrode 22 and two emitter electrodes 23 and 24 are formed. As shown in FIG. 5, the transistor chip Q2 is fabricated. The transistor chip Q2 has a lower surface on which a collector electrode 21 is formed entirely or partly, and an upper surface on which a base electrode 22 and emitter electrode 23 are formed. The transistor chips Q1 and Q2 are respectively mounted (by die bonding) on the die pads 4 and 8.

To perform this die bonding, eutectic bonding or solder bonding is employed, so that the collector electrodes 21 of the transistor chips Q1 and Q2 are electrically connected to the die pads 4 and 8, respectively.

The base electrode 22 of the transistor chip Q1 and the inner lead portion 1a of the base lead 1 are electrically connected to each other by bonding a base bonding wire 11 across them. The emitter electrodes 23 and 24 of the transistor chip Q1 and the inner lead portion 3a of the emitter lead 3 are electrically connected to each other by bonding emitter bonding wires 12 across them.

The base electrode 22 of the transistor chip Q2 and the inner lead portion 5a of the base lead 5 are electrically connected to each other by bonding a base bonding wire 14 across them. The emitter electrode 23 of the transistor chip Q2 and the inner lead portion 7a of the emitter lead 7 are electrically connected to each other by bonding an emitter bonding wire 15 across them.

The lead frame on which die bonding and wire bonding described above are performed is housed in a mold and encapsulated with a molding resin. After the mold is solidified, dam bars (not shown) are cut so that the respective leads of the lead frame become independent.

When the transistor package is a gull wing lead type package, the outer lead portions of the respective leads are shaped into predetermined shapes by the mold. When the transistor package is a flat lead type package, lead shaping is unnecessary.

In this manner, the twin transistor package as shown in FIGS. 1A and 1B or FIGS. 2A and 2B is completed. The manufacturing process of the twin transistor package according to this embodiment is the same as that of a conventional twin transistor except that two emitter bonding wires are bonded to the transistor chip Q1.

According to this embodiment, in the transistor chip Q1, the inner lead portion 3a of the emitter lead 3 is arranged between the inner lead portion 1a of the base lead 1 and the inner lead portion 2a (die pad 4) of the collector lead 2. Hence, the base lead 1 and collector lead 2 are not adjacent to each other.

Similarly, in the transistor chip Q2, the inner lead portion 7a of the emitter lead 7 is arranged between the inner lead portion 5a of the base lead 5 and the inner lead portion 6a (die pad 8) of the collector lead 6. Hence, the base lead 5 and collector lead 6 are not adjacent to each other.

Furthermore, those areas on the emitter leads 3 and 7 where wires can be bonded, i.e., the inner lead portions 3a and 7a, are large. Thus, two or more emitter bonding wires can be connected to the inner lead portions 3a and 7a. In this embodiment, the transistor chip Q1 has two emitter bonding wires 12.

The twin transistor package according to this embodiment is made on an assumption that both the transistor chips Q1 and Q2 are used as their emitters are grounded. When the transistor chips Q1 and Q2 are to be used with their emitters being grounded, their input terminals become bases and their output terminals become collectors.

In the transistor chip Q1 of the package, the base lead 1 and collector lead 2 are not adjacent to each other, and the emitter lead 3 serving as a ground electrode is arranged between the base lead 1 and collector lead 2. Hence, the electric interference between input and output of the transistor chip Q1 can be decreased, so that high isolation can be realized.

Similarly, also in the transistor chip Q2 of the package, the base lead 5 and collector lead 6 are not adjacent to each other, and the emitter lead 7 serving as a ground electrode is arranged between the base lead 5 and collector lead 6. Hence, the electric interference between input and output of the transistor chip Q2 can be decreased, so that high isolation can be realized.

Concerning the transistor chip Q1, since the two emitter bonding wires 12 are provided, the parasitic inductance of the emitter can be decreased.

[Second Embodiment]

Figure 6:
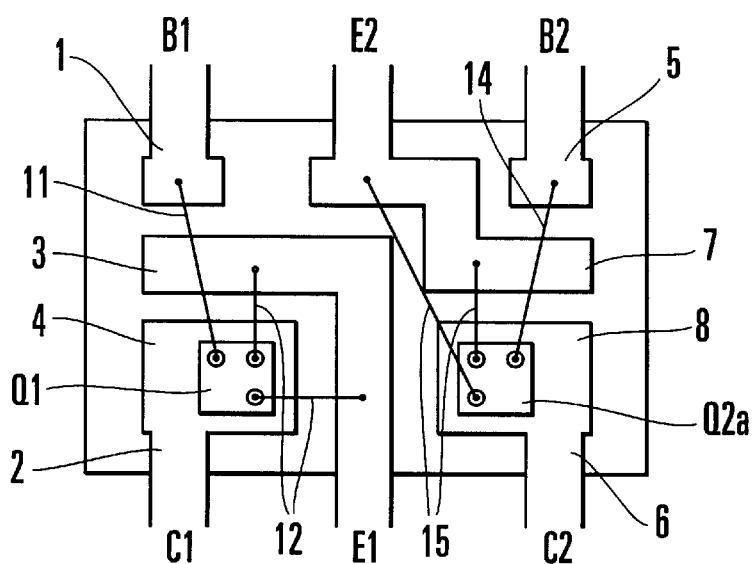
FIG. 6 is a plan view showing the arrangement of components in a twin transistor package according to the second embodiment of the present invention.

FIG. 6 shows the arrangement of components in a twin transistor package according to the second embodiment of the present invention. In FIG. 6, the molded resin is looked through.

In this embodiment, a transistor chip Q2a has two emitter electrodes, in the same manner as the transistor chip Q1, and has two emitter bonding wires 15. Except for this, the arrangement of the second embodiment is the same as that of the first embodiment.

Hence, in addition to the effect of the first embodiment, the parasitic inductance of the emitter can be decreased also in a transistor chip Q2.

[Third Embodiment]

Figure 7:
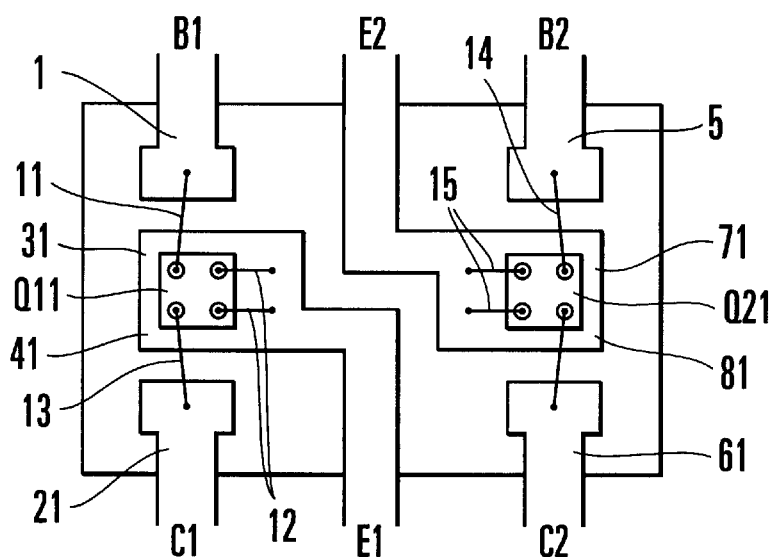
FIG. 7 is a plan view showing the arrangement of components in a twin transistor package according to the third embodiment of the present invention.

FIG. 7 shows the arrangement of components in a twin transistor package according to the third embodiment of the present invention. In FIG. 7, a molded resin is looked through.

In this embodiment, transistor chips Q11 and Q21 are mounted on the inner lead portions of emitter leads 31 and 71. Accordingly, the inner lead portions of the emitter leads 31 and 71 also serve as die pads 41 and 81 on which the transistor chips Q11 and Q21 are to be mounted.

Figure 8A:
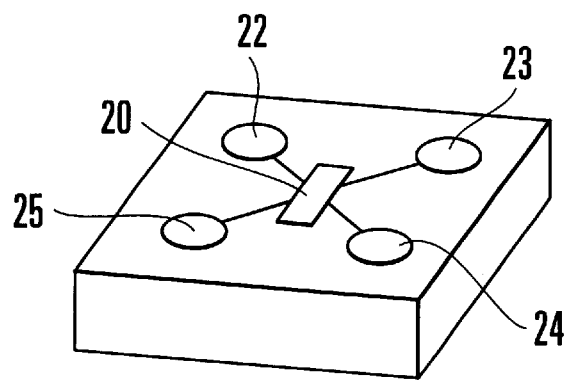
FIGS. 8A and 8B are perspective views of the first and second transistors, respectively, shown in FIG. 7.
Figure 8B:
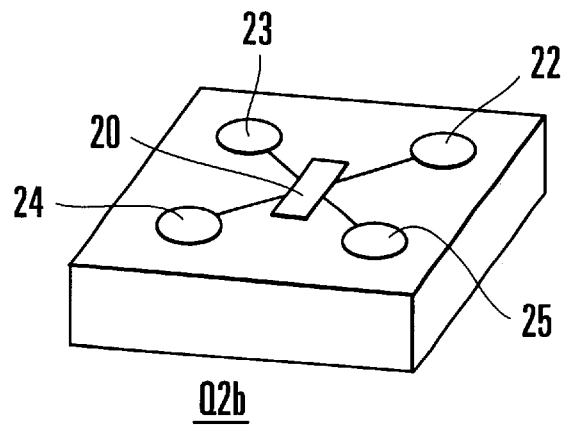
Figure 9:
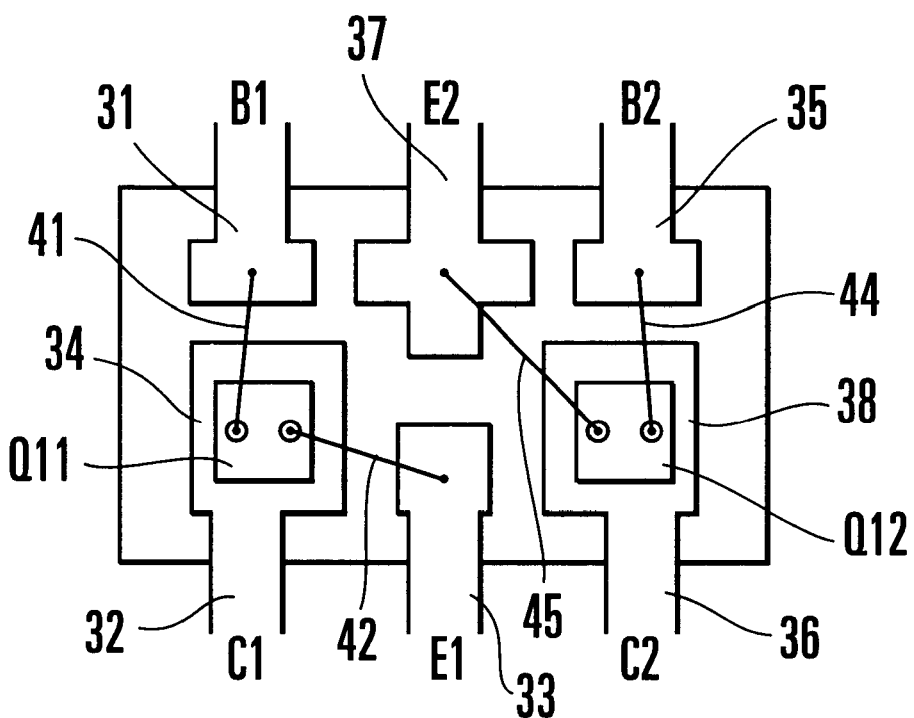
FIG. 9 is a plan view showing the arrangement of components in a conventional twin transistor package.

A method of manufacturing this twin transistor package will now be described. As shown in FIG. 8A, the first transistor chip Q11 is fabricated. The first transistor chip Q11 has an upper surface on which a base electrode 22, two emitter electrodes 23 and 24, and a collector electrode 25 are formed. As shown in FIG. 8B, the second transistor chip Q21 is fabricated. The second transistor chip Q21 has an upper surface on which a base electrode 22, two emitter electrodes 23 and 24, and a collector electrode 25 are formed. No electrodes are formed on the lower surfaces of the first and second transistor chips Q11 and Q21.

Subsequently, the transistor chips Q11 and Q21 are respectively mounted (by die bonding) on the die pads 41 and 81. A base bonding wire 11 is bonded across the base electrode 22 of the transistor chip Q11 and the inner lead portion of a base lead 1. Emitter bonding wires 12 are bonded across the emitter electrodes 23 and 24 of the transistor chip Q11 and the inner lead portion of the emitter lead 31. A collector bonding wire 13 is bonded across the collector electrode 25 of the transistor chip Q11 and the inner lead portion of a collector lead 21.

A base bonding wire 14 is bonded across the base electrode 22 of the transistor chip Q21 and the inner lead portion of a base lead 5. Emitter bonding wires 15 are bonded across the emitter electrodes 23 and 24 of the transistor chip Q21 and the inner lead portion of the emitter lead 71. A collector bonding wire 16 is bonded across the collector electrode 25 of the transistor chip Q21 and the inner lead portion of a collector lead 61.

Steps after this are the same as those of the first embodiment.

According to the third embodiment, in the transistor chip Q11, the inner lead portion of the emitter lead 31 is arranged between the inner lead portion of the base lead 1 and the inner lead portions of the collector lead 21, in the same manner as in the first embodiment. Hence, the base lead 1 and collector lead 21 are not adjacent to each other.

Similarly, in the transistor chip Q21, the inner portion of the emitter lead 71 is arranged between the inner lead portion of the base lead 5 and the inner lead portion of the collector lead 61. Hence, the base lead 5 and collector lead 61 are not adjacent to each other.

As a result, the same effect as that of the first embodiment can be obtained.

Furthermore, those areas on the emitter leads 31 and 71 where wires can be bonded, i.e., the inner lead portions, are large. Thus, two or more emitter bonding wires can be connected to the inner lead portions. In this embodiment, the transistor chip Q11 has two emitter bonding wires 12, and the transistor chip Q21 has two emitter bonding wires 15.

Therefore, the parasitic inductances of the emitters of the transistor chips Q11 and Q21 can be decreased.

According to the present invention, the inner lead portion of the emitter lead is arranged between the inner lead portion of the base lead and the inner lead portion of the collector lead. As a result, high isolation between the collector and the base can be realized, and the gain and transition frequency of the transistor chips can be increased.

More specifically, the collector-base capacitance of the package becomes, e.g., about 10 fF or less. When compared to the conventional package, an S parameter S12 indicating isolation is improved by −4 dl to −7 dl, the gain is improved by about 2 dl, and the transition frequency is improved by 2 GHz to 5 GHz.

The inner lead portion of the emitter lead is arranged between the inner lead portion of the base lead and the inner lead portion of the collector lead. In addition, the emitter electrode of the transistor chip and the inner lead portion of the emitter lead are connected to each other through a plurality of wires. Therefore, high isolation between the collector and the base can be realized, and the parasitic inductance of the emitter can be decreased (if two emitter bonding wires are used, the inductance becomes ½ that obtained when one emitter bonding wire is used). As a result, the gain and transition frequency of the transistor chips can be improved.

More specifically, the collector-base capacitance of the package becomes, e.g., about 10 fF or less. When compared to the conventional package, the S parameter S12 indicating isolation is improved by −4 dl to −7 dl, the gain is improved by about 4 dl, and the transition frequency is improved by 2 GHz to 5 GHz.

What is claimed is:

1. A semiconductor device comprising:
a first transistor chip;
a first base lead, a first collector lead, and a first emitter lead respectively having inner lead portions connected to said first transistor chip, wherein the inner lead portion of the first emitter lead is arranged between the inner lead portion of the first base lead and the inner lead portion of the first collector lead, and is bent at least once;
a second transistor chip; and
a second base lead, a second collector lead, and a second emitter lead respectively having inner lead portions connected to said second transistor chip, wherein the inner lead portion of the second emitter lead is arranged between the inner lead portion of the second base lead and the inner lead portion of the second collector lead, and is bent at least once, wherein
one of said inner lead portion of said first emitter lead and said inner lead portion of said second emitter lead is bent once, and
the other one of said inner lead portion of said first emitter lead and said inner lead portion of said second emitter lead is bent twice, said other one thus being bent differently from said one.

2. A semiconductor device comprising:
a first transistor chip having a plurality of emitter electrodes;
a first base lead, a first collector lead, and a first emitter lead respectively having inner lead portions connected to said first transistor chip, wherein the inner lead portion of the first emitter lead is arranged between the inner lead portion of the first base lead and the inner lead portion of the first collector lead;
a second transistor chip having a plurality of emitter electrodes; and
a second base lead, a second collector lead, and a second emitter lead respectively having inner lead portions connected to said second transistor chip, wherein the inner lead portion of the second emitter lead is arranged between the inner lead portion of the second base lead and the inner lead portion of the second collector lead, wherein
said emitter electrodes of said first transistor chip and said inner lead portion of said first emitter lead are connected to each other through a plurality of wires,
said emitter electrodes of said second transistor chip and said inner lead portion of said second emitter lead are connected to each other through a plurality of wires, and
said first and second transistor chips are respectively mounted on said inner lead portions of said first and second emitter leads.

3. A semiconductor device comprising:
a first transistor chip;
a first base lead, a first collector lead, and a first emitter lead respectively having inner lead portions connected to said first transistor chip, wherein the inner lead portion of the first emitter lead has a left side and a right side substantially parallel to said left side, is arranged between the inner lead portion of the first base lead and the inner lead portion of the first collector lead, and is bent at least once;
a second transistor chip; and
a second base lead, a second collector lead, and a second emitter lead respectively having inner lead portions connected to said second transistor chip, wherein the inner lead portion of the second emitter lead has a left side and a right side substantially parallel to said left side, is arranged between the inner lead portion of the second base lead and the inner lead portion of the second collector lead, and is bent at least once.

4. The device according to claim 3, wherein the inner lead portion of the first emitter lead and the inner lead portion of the second emitter lead are L-shaped.

5. The device according to claim 3, wherein the inner lead portion of the first emitter lead and the inner lead portion of the second emitter lead are double L-shaped.

6. The device according to claim 3, wherein the inner lead portion of the first emitter lead is L-shaped and the emitter lead portion of the second emitter lead is double L-shaped.

* * * * *